(12) United States Patent
Nie et al.

(10) Patent No.: US 12,501,589 B2
(45) Date of Patent: Dec. 16, 2025

(54) SERVER HEAT DISSIPATION SYSTEM BASED ON GRAVITY HEAT PIPE

(71) Applicants: Zhuhai Hengqin Neogenint Intelligent Technology Co., Ltd., Zhuhai (CN); Guangdong Institute of Intelligent Science and Technology, Guangdong (CN)

(72) Inventors: Lei Nie, Shanghai (CN); Shiyan Li, Shanghai (CN); Man Zhang, Shanghai (CN); Wenping Kong, Shanghai (CN); Su Sun, Shanghai (CN)

(73) Assignees: Zhuhai Hengqin Neogenint Intellingent Technology Co., Ltd, Zhuhai (CN); Guangdong Institute of Intelligent Science and Technology, Zhuhai (CN)

( * ) Notice: Subject to any disclaimer, the term of this patent is extended or adjusted under 35 U.S.C. 154(b) by 222 days.

(21) Appl. No.: 18/301,847

(22) Filed: Apr. 17, 2023

(65) Prior Publication Data

US 2024/0130090 A1  Apr. 18, 2024

(30) Foreign Application Priority Data

Oct. 18, 2022 (CN) .......................... 202211275032.3

(51) Int. Cl.
  *H05K 7/20* (2006.01)
  *F28D 15/02* (2006.01)

(52) U.S. Cl.
  CPC ......... *H05K 7/20809* (2013.01); *F28D 15/02* (2013.01); *H05K 7/20336* (2013.01)

(58) Field of Classification Search
  CPC . H05K 7/20809; H05K 7/20336; F28D 15/02
  (Continued)

(56) References Cited

U.S. PATENT DOCUMENTS 7,957,132 B2   6/2011  Fried
10,448,543 B2  10/2019 Farshchian et al.
(Continued)

FOREIGN PATENT DOCUMENTS

CN  203561255 U  4/2014
CN  206876025 U  1/2018
(Continued)

*Primary Examiner* — Zhengfu J Feng
(74) *Attorney, Agent, or Firm* — HSML P.C.

(57) ABSTRACT

The present disclosure provides a server heat dissipation system based on gravity heat pipe for dissipating heat from chip of a server, comprising: an evaporator arranged in a chassis of the server and being in thermal contact with the chip, said evaporator having a first cavity internally; a condenser arranged above the server, said condenser having a second cavity internally; and an heat-insulated pipe section passing through the chassis and connecting the evaporator and the condenser, and communicating the first cavity and the second cavity, wherein the evaporator, the condenser and the insulated pipe section are made to form a gravity heat pipe to accommodate working substance that realizes conversion cycles between liquid state and gaseous state by retracting and releasing heat; wherein the heat generated by the chip is transferred to the working substance in liquid state in the first cavity through the evaporator, the working substance absorbs heat and is converted into gaseous state, rising to the second cavity of the condenser through the heat-insulated pipe section, the heat of the working substance is transferred to an external environment through the condenser, and the working substance is converted into liquid state and descends to the first cavity through the heat-insulated pipe section. The present disclosure effectively solves a heat dissipation problem of the chip, while enabling to reduce the power consumption index of an environment where the server is located because the gravity heat pipe does not rely on electricity to operate.

20 Claims, 3 Drawing Sheets

(58) Field of Classification Search
USPC .......................................................... 361/700
See application file for complete search history.

(56) References Cited

U.S. PATENT DOCUMENTS

| | | | |
|---|---|---|---|
| 10,856,448 B1 | 12/2020 | Wiley et al. | |
| 2011/0105010 A1 | 5/2011 | Day | |
| 2013/0343000 A1* | 12/2013 | Shi | H01L 23/49833 |
| | | | 361/717 |
| 2016/0313069 A1* | 10/2016 | Nakamura | F28D 15/0266 |
| 2016/0330873 A1* | 11/2016 | Farshchian | H05K 7/20663 |
| 2020/0350229 A1* | 11/2020 | Chang | H05K 7/20309 |

FOREIGN PATENT DOCUMENTS

| | | |
|---|---|---|
| CN | 212064728 U | 12/2020 |
| EP | 3089571 B1 | 1/2019 |
| JP | 6358872 B2 | 7/2018 |
| TW | 200301855 A | 7/2003 |
| TW | M643090 U | 6/2023 |

\* cited by examiner

SERVER HEAT DISSIPATION SYSTEM BASED ON GRAVITY HEAT PIPE

TECHNICAL FIELD

The present disclosure relates to the field of computer technology, in particular to a server heat dissipation system based on gravity heat pipe.

BACKGROUND

While the development of data center is booming, the energy consumption issue in the industry has also attracted widespread attention from all walks of life. Especially after our country proposed the goals of "carbon peak" in 2030 and "carbon neutrality" in 2060, the issue of green development of data centers has become particularly urgent. Since 2020, various PUE (Energy Use Efficiency) related policies have been intensively introduced at all levels from the state to the local level to drive the development of data centers in the direction of green energy conservation. Green clean energy and energy-efficient energy-saving technologies will be the future development direction of data center energy. Relevant national ministries and local governments have introduced energy efficiency standards and regulatory policies for data center construction, and data center construction has also entered an era of strong energy efficiency regulation. PUE will be a hard constraint for data center construction.

Therefore, a technical solution is needed to solve the problem of high power density heat dissipation and heat transfer in the working process of high-performance computing chips in the data center while significantly reducing the PUE index and electricity cost during the operation of the data center.

SUMMARY

In order to overcome above-mentioned shortcoming, the present disclosure is proposed to solve the problem of high power density heat dissipation and heat transfer in the working process of high-performance computing chips in the data center while significantly reducing the PUE index and electricity cost during the operation of the data center.

In view of the above, the present disclosure provides a server heat dissipation system based on gravity heat pipe for dissipating heat from chip of a server, comprising: an evaporator arranged in a chassis of the server and being in thermal contact with the chip, the evaporator having a first cavity internally; a condenser arranged above the server, the condenser having a second cavity internally; and an heat-insulated pipe section passing through the chassis and connecting the evaporator and the condenser, and communicating the first cavity and the second cavity, wherein the evaporator, the condenser and the insulated pipe section are made to form a gravity heat pipe to accommodate working substance that realizes conversion cycles between liquid state and gaseous state by retracting and releasing heat; wherein the heat generated by the chip is transferred to the working substance in liquid state in the first cavity through the evaporator, the working substance absorbs heat and is converted into gaseous state, rising to the second cavity of the condenser through the heat-insulated pipe section, the heat of the working substance is transferred to an external environment through the condenser, and the working substance is converted into liquid state and descends to the first cavity through the heat-insulated pipe section.

Preferably, in the aforementioned server heat dissipation system, the chip is CPU and/or GPU.

Preferably, in the aforementioned server heat dissipation system, the evaporator is mounted on the chassis as a primary load-bearing structure, and the upper portion of the chip is fixed on the lower surface of the evaporator.

Preferably, in the aforementioned server heat dissipation system, the evaporator includes a cover plate, a bottom plate and a capillary structure, the cover plate and the bottom plate mate to form the first cavity, the capillary structure is mounted on an upper surface of the bottom plate and is in contact with the working substance, upper portion(s) of one or more said chip is mounted on an lower surface of the bottom plate through an insulated and thermally conductive fixture, and the heat from the chip is transferred to the working substance through the lower surface of the bottom plate and the capillary structure.

Preferably, in the aforementioned server heat dissipation system, the working substance is deionized water, liquid ammonia, acetone or chlorofluorocarbons, or the like.

Preferably, in the aforementioned server heat dissipation system, the condenser has a plurality of fins for transferring heat to the external environment.

Preferably, in the aforementioned server heat dissipation system, further comprising a condenser heat exchanger mounted on the condenser for driving a medium in the external environment of the condenser to flow to take away the heat transferred from the condenser to the external environment.

Preferably, in the aforementioned server heat dissipation system, further comprising a refrigeration device for decreasing a temperature of the medium in the external environment of the condenser and the condenser heat exchanger, such the heat from the chip is transferred to the medium in the external environment of the condenser and the condenser heat exchanger.

Preferably, in the aforementioned server heat dissipation system, further comprising a switching module determining whether to start the condenser heat exchanger or the refrigeration device according to the temperature of the medium in the external environment of the condenser.

Preferably, in the aforementioned server heat dissipation system, the outer surface of the heat-insulated pipe section is covered with heat-insulated and flame-retardant material.

The above-mentioned one or more technical solutions of the present disclosure have at least one or more of the following beneficial effects:

In the technical solution of the present disclosure, the evaporator, the condenser, and the heat-insulated pipe section form a gravity heat pipe. The heat generated by the chip is absorbed by the working substance in liquid state in the evaporator, and then the working substance is converted into a gaseous state and rises to the condenser. The condenser releases the heat of the working substance to the external environment, and the working substance is converted back into liquid state, descends into the evaporator under the action of gravity, and continues to absorb the heat from the chip, thereby effectively solving the problem of chip heat dissipation. In the meantime, the electricity consumption index of the environment where the server is located can be reduced because the gravity heat pipe does not rely on electricity to operate. In addition, since the evaporator is arranged in the chassis and is in direct contact with the chip, the chip is located between the circuit board and the evaporator, forming a good support for the chip.

BRIEF DESCRIPTION OF DRAWINGS

The disclosure of the present invention will become more comprehensible with reference to the accompanying drawings. Those skilled in the art can easily understand that: these drawings are only for the purpose of illustration, and are not intended to limit the protection scope of the present disclosure. Specifically.

DETAILED DESCRIPTION

Some embodiments of the present disclosure are described below with reference to the accompanying drawings. Those skilled in the art should understand that these embodiments are only used to explain the technical principles of the present disclosure, and are not intended to limit the protection scope of the present disclosure.

Figure 1:
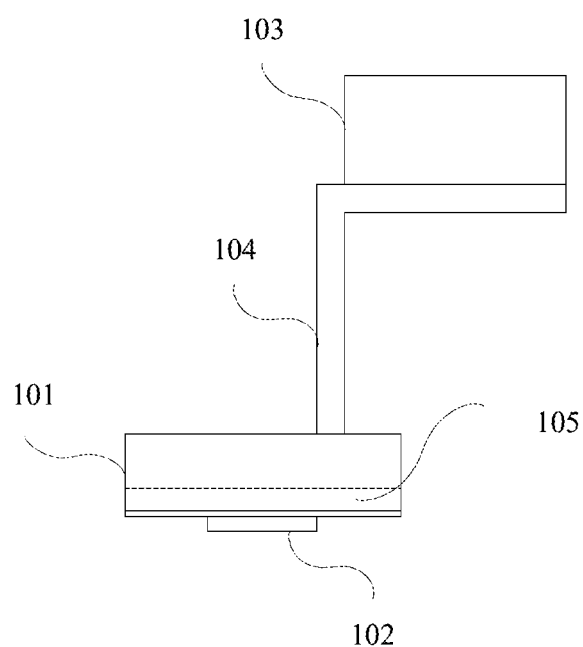
FIG. 1 is a block diagram of the server heat dissipation system based on gravity heat pipe according to an embodiment of the present disclosure.

As shown in FIG. 1, an embodiment of the present disclosure provides a server heat dissipation system based on gravity heat pipe for dissipating heat from a chip of a server. The server can be either a separate server or a server cluster located in a data center. The system includes:

an evaporator 101 arranged in a chassis of the server and being in contact with a chip 102. The evaporator 101 has a first cavity internally.

In this embodiment, since the evaporator 101 is arranged in the chassis and in direct contact with the chip 102, the chip 102 is located between the circuit board and the evaporator 101, forming a good support for the chip 102. In this embodiment, the chip 102 may be CPU or GPU, the solution of this embodiment can therefore dissipate heat for CPU and GPU.

A condenser 103 is arranged above the server, the condenser 103 has a second cavity internally.

A heat-insulated pipe section 104 passes through the chassis and connects the evaporator 101 and the condenser 103, and communicates the first cavity and the second cavity. The evaporator 101, the condenser 103 and the insulated pipe section 104 are made to form a gravity heat pipe to accommodate working substance 105 that realizes conversion cycles between liquid state and gaseous state by retracting and releasing heat.

In this embodiment, the working substance 105 includes, but is not limited to, substance type of deionized water, liquid ammonia, acetone, or chlorofluorocarbons, which are prone to gas-liquid phase transition and have excellent heat transfer quality.

In accordance with the working principle of gravity heat pipe, heat generated by the chip 102 is transferred to the working substance 105 in liquid state in the first cavity through the evaporator 101, the working substance 105 absorbs heat and is converted into gaseous state, rising to the second cavity of the condenser 103 through the heat-insulated pipe section 104, the heat of the working substance 105 is transferred to an external environment through the condenser 103, and the working substance 105 is converted into liquid state and descends to the first cavity through the heat-insulated pipe section 104.

According to the technical solution of this embodiment, the evaporator 101, the condenser 104, and the heat-insulated pipe section 105 form a gravity heat pipe. The heat generated by the chip 105 is absorbed by the working substance 105 in liquid state in the evaporator 101, and then the working substance 105 is converted into a gaseous state and rises to the condenser 103. The condenser 103 releases the heat of the working substance 105 to the external environment, and the working substance 105 is converted into liquid state again, descends into the evaporator 101 under the action of gravity, and continues to absorb the heat from the chip 102, thereby effectively solving the heat dissipation problem of the chip 102. In the meantime, the electricity consumption index of the environment where the server is located can be reduced because the gravity heat pipe does not rely on electricity to operate. In addition, since the evaporator 101 is arranged in the chassis and is in direct contact with the chip 102, the chip 102 is located between the circuit board and the evaporator 101, forming a good support for the chip 102.

Figure 2:
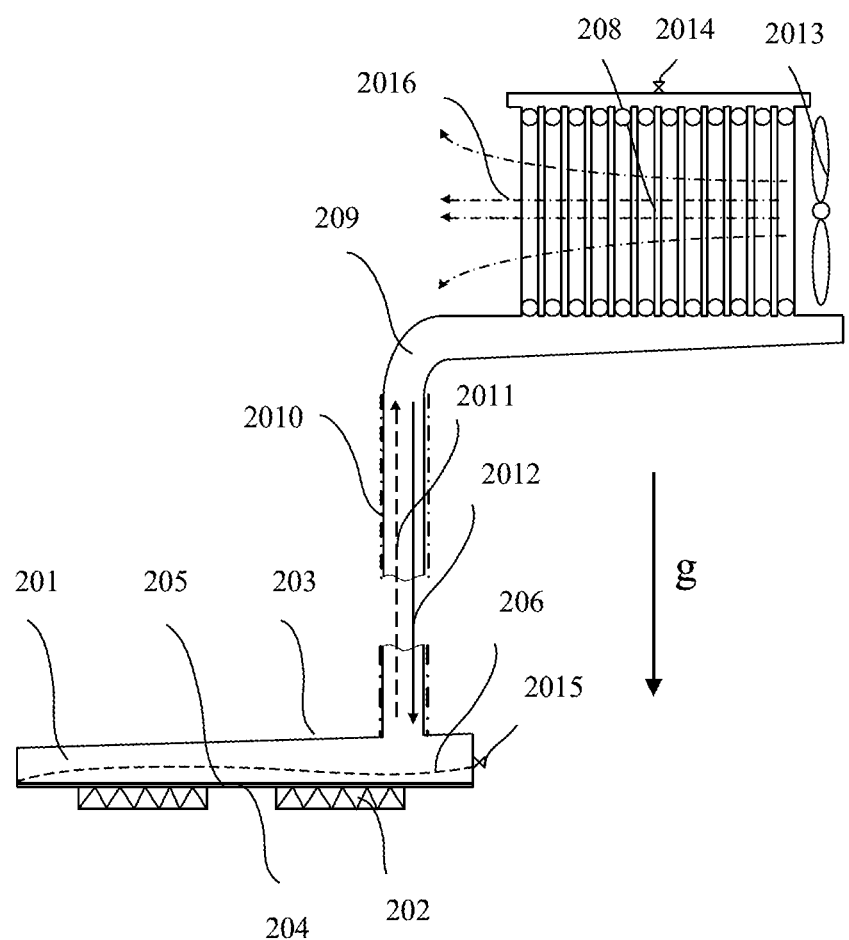
FIG. 2 is a schematic diagram of the server heat dissipation system based on gravity heat pipe according to an embodiment of the present disclosure.
Figure 3:
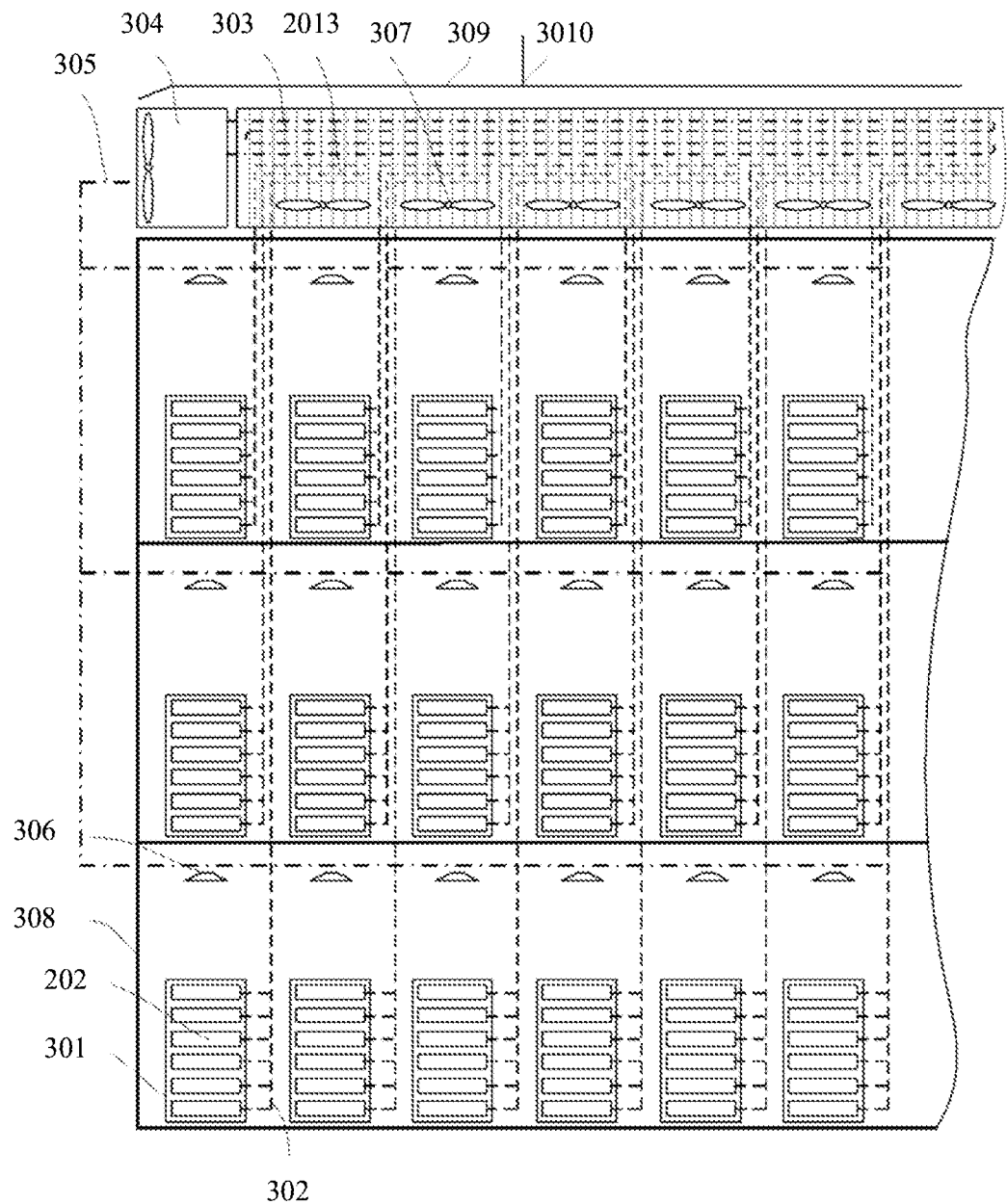
FIG. 3 is a schematic diagram of the server heat dissipation system based on gravity heat pipe being applied to a data center according to an embodiment of the present disclosure.

As shown in FIG. 2 and FIG. 3, an embodiment of the present invention provides a server heat dissipation system based on gravity heat pipe. The technical solution of this embodiment is applied to the heat dissipation system design of high-power CPU/GPU computing chips in data centers/servers. In this embodiment, the data center server can be arranged in a manner of layered arrangement of standard cabinets, and can be arranged in a single-layer, double-layer, three-layer or even multi-layer structure according to the building structure of the data center. The CPU/GPU modules of the server are both independently dissipated by gravity heat pipe. The system of this embodiment includes:

an evaporator 201 mounted on the chassis of the server 301, the upper portion of the chip 202 is fixed on the lower surface of the evaporator 201, specifically, the evaporator 201 includes a cover plate 203, a bottom plate 204 and a capillary structure 205, the cover plate 203 and the bottom plate 204 mate to form the first cavity, the capillary structure 205 is mounted on an upper surface of the bottom plate 204 and is in contact with the working substance 206, upper portion(s) of one or more said chip 202 is mounted on an lower surface of the bottom plate 204 through an insulated and thermally conductive fixture, and the heat from the chip 202 is transferred to the working substance 206 through the lower surface of the bottom plate 204 and the capillary structure 205.

In this embodiment, the high-power heat generation device (i.e. chip) 202 is thermally mounted with the lower surface of the evaporator 201 to ensure that the upper portion of the CPU/GPU chip 202 is closely attached to the bottom plate, in particular, thermally mounted with the bottom plate 204 through insulated and thermally conductive fixture, and the fixture can be a screw or a clamp press. The capillary structure 205, the cover plate 203 and the bottom plate 204 are sintered and vacuum brazed to form a closed first cavity, which is internally filled with working substance 206 in liquid state. The bottom plate 204 is thermally connected to a plurality of high-power heat generation devices 202, and the capillary structure 205 is internally filled with working substance 206 in liquid state to ensure that the inner surface of the bottom plate 204 is wet. The capillary structure 205 is fixed on the bottom plate 204, and can be configured by one or a combination of metal powder sintering, wire mesh or groove structure; the cover plate 203 and the bottom plate 204 can be processed by metal material such as copper-based metal material, aluminum-based metal materials, or stainless steel, which have good weldability, low cost, and good compatibility with working substance.

A condenser 207 is arranged above the server 301, the condenser 207 has a second cavity internally. The condenser 207 has a plurality of fins for transferring heat to the external environment. The fins of the condenser 207 are vertically arranged, which is beneficial to the rising and cooling of the working substance 206 in gaseous state and the backflow of the working substance 206 in liquid state.

A heat-insulated pipe section 209 passes through the chassis of the server 301 and connects the evaporator 201 and the condenser 207, and communicates the first cavity and the second cavity. The evaporator 201, the condenser 207 and the insulated pipe section 209 are made to form a gravity heat pipe 302 to accommodate working substance 206 that realizes conversion cycles between liquid state and gaseous state by retracting and releasing heat. The upper portion of the evaporator 201 communicates with the heat-insulated pipe section 209. The outer surface of the heat-insulated pipe section 209 is covered with a thermal insulation material 2010 close to the diameter of the heat insulation. The thermal insulation material 2010 is not limited to polyurethane foam, multi-layer insulation components, and the like.

In this embodiment, the heat-insulated pipe section 209 is insulated from the environment by the thermal insulation material 2010. The overall layout of the system keeps the evaporator 201 at the bottom and the condenser 207 at the top, and the arrangement of the heat-insulated pipe section 209 should be ensured to facilitate the backflow of the working substance 206 in liquid state. The heat-insulated pipe section 209 is uniformly led out from the side plate or the back plate of the chassis, and then extends along the height direction to the condenser 207 on the upper floor of the building for dissipation. The heat-insulated pipe section 209 is assembled in a manner of segmented processing, on-site assembling and flexible layout in combination with specific features of the building. Each pipe section of the heat-insulated pipe section 209 is connected by first sealed screwing followed by welding. The inner surface of the heat-insulated pipe section 209 is passivated, and its outer surface is thermally isolated from the environment by the thermal insulation material 2010. The specific implementation process of the heat-insulated pipe section 209 should ensure that it is fixed in a way that facilitates backflow of the working substance 206 in liquid state, and the horizontal arrangement should maintain an inclination angle of 10° to 15°.

In accordance with the working principle of gravity heat pipe, heat generated by the chip 202 is transferred to the working substance 105 in liquid state in the first cavity through the evaporator 201, the working substance 206 absorbs heat and is converted into gaseous state, rising to the second cavity of the condenser 209 in the first direction 2011 through the heat-insulated pipe section 206, the heat of the working substance 206 is transferred to an external environment through the condenser 207, and the working substance 206 is converted into liquid state and under the effect of gravity (the 'g' in FIG. 2 represents gravity), descends to the first cavity in the second direction 2012 through the heat-insulated pipe section 207.

A condenser heat exchanger 2013 is mounted on the condenser 207 for driving a medium in the external environment of the condenser 207 to flow to take away the heat transferred from the condenser 207 to the external environment. The external environment medium may be air, water or other cooling medium.

In this embodiment, the condenser 207 and the condenser heat exchanger 2013 are designed integrally. In order to increase the heat dissipation area of the condenser 207, a condenser heat exchanger 2013 is added on the surface of the condenser 207. The condenser heat exchanger 2013 can significantly increase the natural convection and forced heat dissipation capacity of the system; on the other hand, the condenser heat exchanger 2013 exchanges heat with the refrigeration heat exchanger 303, further improving the working performance and high-temperature environment adaptability of the system.

In addition, the upper portion of the condenser 207 is provided with a liquid filling valve 2014 and a non-condensable gas degassing valve for injecting the working substance 206 and discharging the non-condensable gas. A liquid discharge valve 2015 is provided on the evaporator 201 for discharging the working substance 206.

A refrigeration device for decreasing the temperature of the medium in the external environment of the condenser 207 and the condenser heat exchanger 2013 causes the heat from the chip 203 to be transferred to the medium in the external environment of the condenser 207 and the condenser heat exchanger 2013.

A switching module determines whether to start the condenser heat exchanger 2013 or the refrigeration device according to the temperature of the medium in the external environment of the condenser 207.

In this embodiment, a refrigeration device is provided and can be on-off controlled through the switching module. In this embodiment, the refrigeration device includes a refrigeration unit 304, a refrigeration and air conditioning pipeline 305, a refrigeration and air conditioning outlet 306, a refrigeration heat exchanger 303 and the like, adjusting the air temperature and humidity in the workplace of the data center server 301, and providing auxiliary cooling instructed by switching module when necessary, and reducing the temperature level of the server CPU/GPU module 202.

In this embodiment, the switching module, in combination with the condenser 207, the condenser heat exchanger 2013 and the refrigeration heat exchanger 303, can dissipates system heat in three cooling modes—natural convection, forced convection and auxiliary refrigeration—according to the ambient temperature (air, water or other medium), each mode can be switched automatically. Specifically, natural convection means that when the temperature of the ambient medium is low, the condenser 207 and the condenser heat exchanger 2013 directly perform natural convection heat exchange with the ambient medium without consuming additional energy. Such mode saves the most electric energy and has the lowest PUE index. Forced convection means that when the temperature of the ambient medium is moderate, a driving device 307 such as the fan or pump of the condenser heat exchanger 2013 is started to accelerate the flow of the ambient medium in the third direction 2016 to enhance heat exchange. Such mode requires a certain amount of energy to drive the fan or pump, this mode also saves energy, and the PUE index is moderate. Auxiliary refrigeration means that when the temperature of the ambient medium is high, in order to ensure that the chip temperature does not exceed the limit to shutdown, the refrigeration unit 304 and the refrigeration heat exchanger 303 reduce the temperature of the condenser heat exchanger 2013 to assist in heat dissipation. Such mode consumes larger power, but still has advantages over traditional heat dissipation approach PUE for data center server. In this embodiment, the gravity heat pipe 302, the data center server 303, the server CPU/GPU module 202, and the data center building structure 308 can all adopt a modular design of standardized mechanical, electrical, and thermal interfaces.

The working principle of the technical solution of this embodiment is: the liquid working substance 206 in the evaporator 201 absorbs heat and gasifies to form a steam of working substance 206, under the suction effect of the capillary structure 205, the surrounding working substance 206 in liquid state quickly replenishes the installation area of the high-power heat generation device 202, ensuring that the working area is in a moist state and will not dry up; the steam of the working substance 206 rises to the heat-insulated pipe section 209 under the buoyancy force, since the heat-insulated pipe section 209 is subjected to adiabatic treatment, there is substantially no heat exchange in this pipe section, and the steam of the working substance 206 does not appear or liquefies only in a small amount, and most of it can smoothly reach the condenser 207 for exothermic liquefaction, after liquefaction, the working substance 206 flows back to the evaporator 204 under the action of gravity to complete heat transfer and circulation of the working substance 206 without consuming other auxiliary energy, thereby achieving the effect of significantly reducing the power usage efficiency (PUE) of the data center/server.

Furthermore, a roof sunshade 309 is required to be provided on the upper portion of the condenser heat exchanger 2013, which can be automatically opened or closed according to heat dissipation or heat preservation requirements to further adjust the heat dissipation capacity of the system; a lightning protection device 3010 or other electrostatic discharge devices is mounted at the top of the building to improve the safety of data center equipment.

The technical solution of this embodiment solves the problem of low power usage efficiency in the existing data center heat dissipation technology by employing passively driven gravity heat pipe as the main cooling channel for CPU/GPU chips, leading a large share of heat consumption in the data center to the heat exchanger on the top floor of the data center for dissipation, without the need for cooling by air conditioning and refrigeration units that consume a large amount of power, the solution can even transmit the heat consumption generated by the CPU and GPU chips of the computing system to the outside for dissipation or secondary recycling, significantly reducing the PUE index and electricity cost during the data center operation process. In the data center applying the technical solution of this embodiment, the equipment room adopts a chassis-type layered layout, and the evaporator is used not only as a heat dissipation structure but also as a supporting structure for circuit board chips, each layer of computing boards inside the chassis is independently dissipated through gravity heat pipes, the required products adopt prefabricated and standardized design, flexible installation and maintenance, stable operation and are close to zero noise, improving the reliability of the heat dissipation system and reducing additional energy consumption. On the basis of the national development strategy of "computing resources from east to west", such new type of green data center can also be used as an effective supplement to the construction of small and medium-sized data centers in cities, with both economic and social benefits and broad application prospects.

In the description provided herein, numerous specific details are set forth. However, it is understood that embodiments of the present disclosure may be practiced without these specific details. In some instances, well-known methods, structures and techniques have not been shown in detail in order not to obscure the understanding of this description.

Similarly, it should be appreciated that in the foregoing description of exemplary embodiments of the present disclosure, in order to streamline this disclosure and to facilitate understanding of one or more of the various inventive aspects, various features of the present disclosure are sometimes grouped together in a single embodiment, figure, or its description. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Those skilled in the art can understand that the modules in the device in the embodiment can be adaptively changed and arranged in one or more devices different from the embodiment. Modules or units or components in the embodiments may be combined into one module or unit or component, and furthermore may be divided into a plurality of sub-modules or sub-units or sub-assemblies. All features disclosed in this specification (including accompanying claims, abstract and drawings), as well as any method as disclosed or all processes or units of device may be combined in any combination, except that at least some of such features and/or processes or units are mutually exclusive. Each feature disclosed in this specification (including accompanying claims, abstract and drawings) may be replaced by alternative features serving the same, equivalent or similar purpose, unless expressly stated otherwise.

Furthermore, those skilled in the art will understand that although some embodiments described herein include some features included in other embodiments but not others, combinations of features from different embodiments are meant to be within the scope of the invention and form different embodiments. For example, in the following claims, any of the claimed embodiments may be used in any combination.

What is claimed is:

1. A server heat dissipation system based on a gravity heat pipe for dissipating heat from a chip of a server, comprising:
    an evaporator arranged in a chassis of the server and being in thermal contact with the chip, said evaporator having a first cavity internally;
    a condenser arranged above the server, said condenser having a second cavity internally; and
    a heat-insulated pipe section passing through the chassis and connecting the evaporator and the condenser, and communicating with the first cavity and the second cavity, wherein the evaporator, the condenser and the insulated pipe section are made to form the gravity heat pipe to accommodate working substance that realizes conversion cycles between liquid state and gaseous state by retracting and releasing heat;
    wherein the heat generated by the chip is transferred to the working substance in liquid state in the first cavity through the evaporator, the working substance absorbs heat and is converted into gaseous state, rising to the second cavity of the condenser through the heat-insulated pipe section, the heat of the working substance is transferred to an external environment through the condenser, and the working substance is converted into liquid state and descends to the first cavity through the heat-insulated pipe section, wherein the evaporator is mounted on the chassis as a load-bearing structure, and the upper portion of the chip is fixed on the lower surface of the evaporator, wherein the evaporator includes a cover plate, a bottom plate and a capillary structure, the cover plate and the bottom plate mate to form the first cavity, the capillary structure is mounted on an upper surface of the bottom plate and is in contact with the working substance, upper portion(s) of one or more said chip is mounted on an lower surface of the bottom plate through an insulated and thermally conductive fixture, and the heat from the chip is transferred to the working substance through the lower surface of the bottom plate and the capillary structure.

2. The server heat dissipation system of claim 1, wherein the chip is CPU and/or GPU.

3. The server heat dissipation system of claim 1, wherein the working substance is deionized water, liquid ammonia, acetone or chlorofluorocarbons, or the like.

4. The server heat dissipation system of claim 1, wherein the condenser has a plurality of fins for transferring heat to the external environment.

5. The server heat dissipation system of claim 1, further comprising:
a condenser heat exchanger mounted on the condenser for driving a medium in the external environment of the condenser to flow to take away the heat transferred from the condenser to the external environment.

6. A server heat dissipation system based on a gravity heat pipe for dissipating heat from a chip of a server, comprising:
an evaporator arranged in a chassis of the server and being in thermal contact with the chip, said evaporator having a first cavity internally;
a condenser arranged above the server, said condenser having a second cavity internally; and
a heat-insulated pipe section passing through the chassis and connecting the evaporator and the condenser, and communicating with the first cavity and the second cavity, wherein the evaporator, the condenser and the insulated pipe section are made to form the gravity heat pipe to accommodate working substance that realizes conversion cycles between liquid state and gaseous state by retracting and releasing heat;
wherein the heat generated by the chip is transferred to the working substance in liquid state in the first cavity through the evaporator, the working substance absorbs heat and is converted into gaseous state, rising to the second cavity of the condenser through the heat-insulated pipe section, the heat of the working substance is transferred to an external environment through the condenser, and the working substance is converted into liquid state and descends to the first cavity through the heat-insulated pipe section,
the server heat dissipation system further comprising:
a condenser heat exchanger mounted on the condenser for driving a medium in the external environment of the condenser to flow to take away the heat transferred from the condenser to the external environment, and
a refrigeration device for decreasing a temperature of the medium in the external environment of the condenser and the condenser heat exchanger, such the heat from the chip is transferred to the medium in the external environment of the condenser and the condenser heat exchanger.

7. The server heat dissipation system of claim 6, further comprising:

a switching module determining whether to start the condenser heat exchanger or the refrigeration device according to the temperature of the medium in the external environment of the condenser.

8. The server heat dissipation system of claim 6, wherein the chip is CPU and/or GPU.

9. The server heat dissipation system of claim 6, wherein the evaporator is mounted on the chassis as a load-bearing structure, and the upper portion of the chip is fixed on the lower surface of the evaporator.

10. The server heat dissipation system of claim 9, wherein the evaporator includes a cover plate, a bottom plate and a capillary structure, the cover plate and the bottom plate mate to form the first cavity, the capillary structure is mounted on an upper surface of the bottom plate and is in contact with the working substance, upper portion(s) of one or more said chip is mounted on an lower surface of the bottom plate through an insulated and thermally conductive fixture, and the heat from the chip is transferred to the working substance through the lower surface of the bottom plate and the capillary structure.

11. The server heat dissipation system of claim 6, wherein the working substance is deionized water, liquid ammonia, acetone or chlorofluorocarbons, or the like.

12. The server heat dissipation system of claim 6, wherein the condenser has a plurality of fins for transferring heat to the external environment.

13. A server heat dissipation system based on a gravity heat pipe for dissipating heat from a chip of a server, comprising:
an evaporator arranged in a chassis of the server and being in thermal contact with the chip, said evaporator having a first cavity internally;
a condenser arranged above the server, said condenser having a second cavity internally; and
a heat-insulated pipe section passing through the chassis and connecting the evaporator and the condenser, and communicating with the first cavity and the second cavity, wherein the evaporator, the condenser and the insulated pipe section are made to form the gravity heat pipe to accommodate working substance that realizes conversion cycles between liquid state and gaseous state by retracting and releasing heat;
wherein the heat generated by the chip is transferred to the working substance in liquid state in the first cavity through the evaporator, the working substance absorbs heat and is converted into gaseous state, rising to the second cavity of the condenser through the heat-insulated pipe section, the heat of the working substance is transferred to an external environment through the condenser, and the working substance is converted into liquid state and descends to the first cavity through the heat-insulated pipe section,
wherein the outer surface of the heat-insulated pipe section is covered with heat-insulated and flame-retardant material.

14. The server heat dissipation system of claim 13, wherein the chip is CPU and/or GPU.

15. The server heat dissipation system of claim 13, wherein the evaporator is mounted on the chassis as a load-bearing structure, and the upper portion of the chip is fixed on the lower surface of the evaporator.

16. The server heat dissipation system of claim 15, wherein the evaporator includes a cover plate, a bottom plate and a capillary structure, the cover plate and the bottom plate mate to form the first cavity, the capillary structure is mounted on an upper surface of the bottom plate and is in contact with the working substance, upper portion(s) of one or more said chip is mounted on an lower surface of the bottom plate through an insulated and thermally conductive fixture, and the heat from the chip is transferred to the working substance through the lower surface of the bottom plate and the capillary structure.

17. The server heat dissipation system of claim 13, wherein the working substance is deionized water, liquid ammonia, acetone or chlorofluorocarbons, or the like.

18. The server heat dissipation system of claim 13, wherein the condenser has a plurality of fins for transferring heat to the external environment.

19. The server heat dissipation system of claim 13, further comprising:
   a condenser heat exchanger mounted on the condenser for driving a medium in the external environment of the condenser to flow to take away the heat transferred from the condenser to the external environment.

20. The server heat dissipation system of claim 19, further comprising:
   a refrigeration device for decreasing a temperature of the medium in the external environment of the condenser and the condenser heat exchanger, such the heat from the chip is transferred to the medium in the external environment of the condenser and the condenser heat exchanger.

* * * * *